United States Patent
Yu

(10) Patent No.: US 8,900,926 B2
(45) Date of Patent: Dec. 2, 2014

(54) CHIP PACKAGE METHOD

(75) Inventor: Chen-Yu Yu, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 50 days.

(21) Appl. No.: 13/459,477

(22) Filed: Apr. 30, 2012

(65) Prior Publication Data
US 2013/0147058 A1   Jun. 13, 2013

(30) Foreign Application Priority Data
Dec. 12, 2011   (TW) .............................. 100145836 A

(51) Int. Cl.
*H01L 21/00*   (2006.01)

(52) U.S. Cl.
USPC ......................................... 438/118; 438/125

(58) Field of Classification Search
USPC ................. 257/678, 701, 710, 711, 782, 783; 438/106, 118, 119, 125
See application file for complete search history.

(56) References Cited

U.S. PATENT DOCUMENTS

| | | | |
|---|---|---|---|
| 5,786,636 A * | 7/1998 | Takahashi | 257/723 |
| 7,208,833 B2 * | 4/2007 | Nobori et al. | 257/704 |
| 7,408,264 B2 * | 8/2008 | Fortin et al. | 257/793 |
| 7,816,794 B2 * | 10/2010 | Sakinada et al. | 257/790 |
| 2003/0122249 A1 * | 7/2003 | Prior | 257/727 |
| 2006/0097405 A1 * | 5/2006 | Webster et al. | 257/782 |
| 2012/0217660 A1 * | 8/2012 | Tani et al. | 257/783 |

* cited by examiner

*Primary Examiner* — S. V. Clark
(74) *Attorney, Agent, or Firm* — Novak Druce Connolly Bove + Quigg LLP

(57) ABSTRACT

A chip package includes a substrate, a pad positioned on the substrate, a base board, at least one adhesive layer and at least one chip. The base board is positioned on the pad. At least one mounting hole is defined through the base board. The at least one adhesive layer is received in the at least one mounting hole. The at least one chip is received in the at least one mounting hole and adhere to the pad via the at least one adhesive layer.

5 Claims, 2 Drawing Sheets

CHIP PACKAGE METHOD

BACKGROUND

1. Technical Field

The present disclosure relates to package structures, and particularly, to a chip package and a package method for making the chip package.

2. Description of Related Art

Chips used in optical transmission systems are very small. For example, an area of a laser diode is 200 um×200 um. During a chip package process, the chips are adhered to a pad via glue. It is difficult to control the amount of the glue. If too much glue is used, the glue will overflow onto the pad. Then, the positions of the chips adhered to the pad may be inaccurate. If not enough glue is used, the chips will easily detach from the pad. This may cause the quality of the product of the optical transmission system to be low.

Therefore, there is room for improvement within the art.

BRIEF DESCRIPTION OF THE DRAWINGS

The components in the drawings are not necessarily drawn to scale, the emphasis being placed upon clearly illustrating the principles of the present disclosure. Moreover, in the drawings, like reference numerals designate corresponding parts throughout several views, and all the views are schematic.

DETAILED DESCRIPTION

Figure 1:
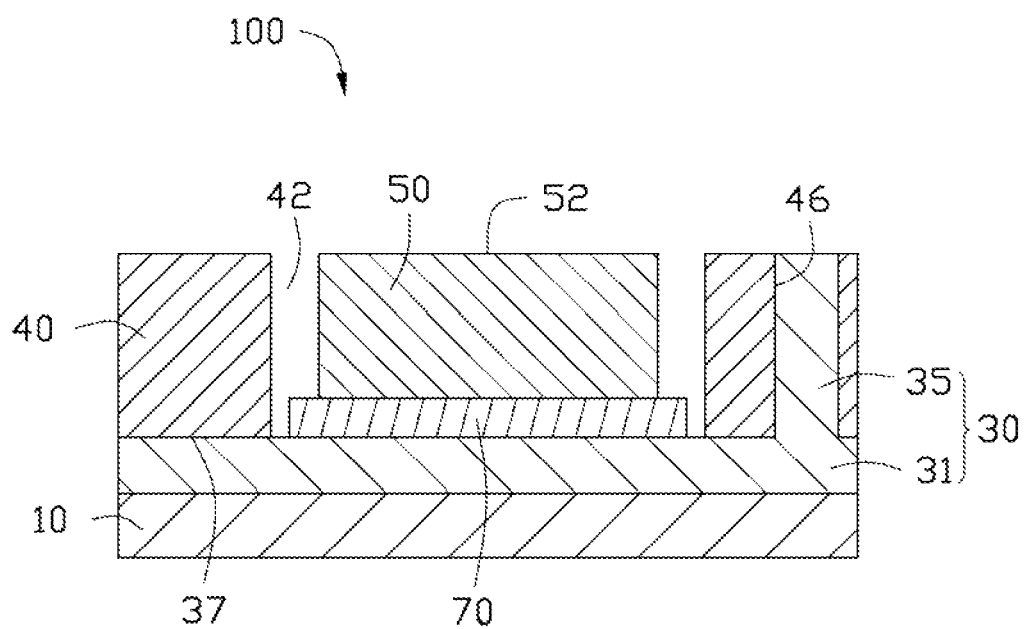
FIG. 1 is a cross-section of an embodiment of a chip package.

FIG. 1 shows a chip package 100, including a substrate 10, a pad 30, a base board 40, a chip 50 and an adhesive layer 70. The pad 30 is sandwiched between the substrate 10 and the base board 40. The chip 50 is received in the base board 40 via the adhesive layer 70.

The substrate 10 is made of insulation material, such as resin, or glass, for example. The substrate 10 can also be made of electrical conductive materials, but an outer surface of the substrate 10 needs to be covered by an insulation layer. The substrate 10 has a large thermal conductivity. Circuits can be arranged on the substrate 10 to drive the chip 50 or other units to work. In the illustrated embodiment, the substrate 10 is a multi-layer printed circuit board.

The pad 30 is soldered on the substrate 10, and made of electrical conductive metal materials, such as cooper, nickel, sliver, or other alloys. The pad 30 is "L" shaped, which includes a base body 31 and a connecting portion 35 extending from one end of the base body 31 to electrically connect with outer electrical elements (not shown). A first surface 37 of the base body 31 is away from the substrate 10. The connecting portion 35 extends away from the substrate 10.

The base board 40 is soldered on the pad 30. The pad 30 is sandwiched between the substrate 10 and the base board 40. A mounting hole 42 is defined through the base board 40 where the chip 50 is packaged. Part of the first surface 37 is exposed in the mounting hole 42. A connecting hole 46 is defined in the base board 40 corresponding to the connecting portion 35. The connecting portion 35 is received in the connecting hole 46. The base board 40 is made of insulation materials, such as resin, glass, and ceramics.

The chip 50 is received in the mounting hole 42 and connects with the pad 30.

The chip 50 is a laser diode or a photo diode. In this embodiment, the area of the chip 50 used in the optical transmission system is about 200 um×200 um. A top surface 52 is defined on the chip 50 away from the pad 30. A width of the chip 50 is smaller than a width of the mounting hole 42. In the illustrated embodiment, the chip 50 is a laser diode; the top surface 52 is an emitting surface of the laser diode.

The adhesive layer 70 is positioned under the chip 50 in the mounting hole 42. The adhesive layer 70 is coated on the part of first surface 37 which is exposed in the mounting hole 42 and is adhered to a bottom surface of the chip 50 away from the top surface 52. The adhesive layer 70 is glutinous and electrical conductive material. The adhesive layer 70 is made of glue. The glue is fused and coated uniformly on the surface 37. The glue is now the adhesive layer 70 which is heated after the chip 50 is fixed to the basing body 31 during a die bond process. In the illustrated embodiment, the adhesive layer 70 is sliver colloid. An area of a top surface of the adhesive layer 70 is larger than that of the bottom surface of the chip 50. In an alternative embodiment, the area of the top surface of the adhesive layer 70 is equal to or smaller than that of the bottom surface of the chip 50.

Figure 2:
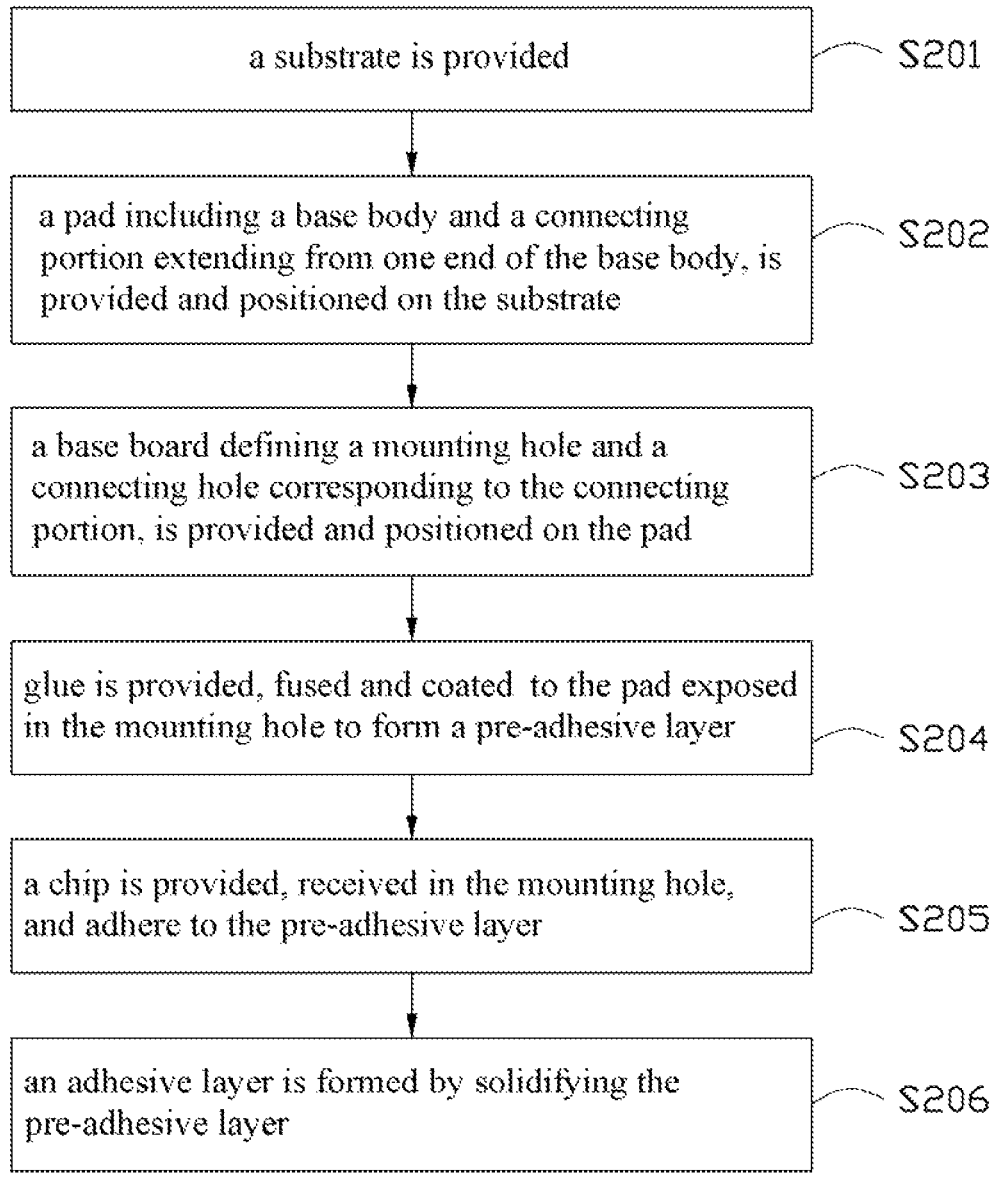
FIG. 2 is a flowchart of a chip package method.

FIG. 2 is an illustrated embodiment of a chip package method for manufacturing the chip package 100 including the following steps.

In step S201, a substrate 10 is provided. The substrate 10 is made of insulation material, such as resin, or glass, for example. The substrate 10 can also be made of electrical conductive materials, as long as an outer surface of the substrate 10 is covered by an insulation layer. The substrate 10 has nice thermal conductivity. Circuits can be arranged on the substrate 10 to drive the chip 50 or other components to work.

In step S202, a pad 30 is provided and soldered on the substrate 10. In this embodiment, the pad 30 is "L" shaped, which includes a base body 31 and a connecting portion 35 extending from one end of the base body 31. A first surface 37 of the base body 31 is away from the substrate 10. The connecting portion 35 extends away from the substrate 10. A wire (not shown) produced by the wire bond extends out of the connecting portion 35 to electrically connect with outer electrical elements (not shown).

In step S203, a base board 40 is provided, and positioned on the pad 30. A mounting hole 42 is defined through the base board 40. Part of the first surface 37 is exposed in the mounting hole 42. A connecting hole 46 is formed in the base board 40 corresponding to the connecting portion 35. The connecting portion 35 is received in the connecting hole 46. The base board 40 is made of insulation materials, such as resin, glass, and ceramics.

In step S204, glue is provided, fused and coated in the mounting hole 42 to form a pre-adhesive layer. In the illustrated embodiment, the glue is sliver colloid.

In step S205, a chip 50 is provided, received in the mounting hole 42, and adhere to the pre-adhesive layer. In the illustrated embodiment, the chip 50 is placed and pressed on the pre-adhesive layer by a vacuum chuck handler (not shown).

In step S206, an adhesive layer 70 is formed by solidifying the pre-adhesive layer, such as by heating or other solid methods.

The mounting hole 42 is defined through in the base board 40 wherein the chip 50 will be packaged for shipping during the die bond process. The fused glue will not overflow because the glue is received in the mounting hole 42, and the position of the chip 50 will not deviate when the chip 50 is fixed to the pad 30. In addition, the wire produced by the wire bond extends out of the connecting portion 35 to electrically connect with outer electrical elements (not shown).

Finally, while various embodiments have been described and illustrated, the disclosure is not to be construed as being limited thereto. Various modifications can be made to the embodiments by those skilled in the art without departing from the true spirit and scope of the disclosure as defined by the appended claims.

What is claimed is:

1. A chip package method, comprising:

providing a substrate;

positioning a pad on the substrate;

positioning a base board on the pad, the base board defining at least one mounting hole;

providing a glue, the glue being coated to the pad exposed in the at least one mounting hole to form at least one pre-adhesive layer;

putting and pressing at least one chip on the pre-adhesive layer by a vacuum chuck handler, the at least one chip received in the at least one mounting hole and adhere to the pre-adhesive layer;

at least one adhesive layer formed by solidifying in the at least one mounting hole.

2. The chip package method of claim 1, wherein the at least one connecting hole is defined through one end of the base board adjacent to the at least one mounting hole.

3. The chip package method of claim 2, wherein the pad comprises a base body and a connecting portion extending from one end of the base body, the connecting portion is received in the connecting hole and extends away from the substrate to electrical conductive connected with outer electrical elements.

4. The chip package method of claim 1, wherein the pad is soldered on the substrate.

5. The chip package method of claim 1, wherein the base board is soldered on the pad.

* * * * *